United States Patent [19]
Elder et al.

[11] Patent Number: 5,123,850
[45] Date of Patent: Jun. 23, 1992

[54] NON-DESTRUCTIVE BURN-IN TEST SOCKET FOR INTEGRATED CIRCUIT DIE

[75] Inventors: Richard A. Elder, Dallas; Randy Johnson, Carrollton; Dean L. Frew, Garland; Arthur M. Wilson, Dallas, all of Tex.

[73] Assignee: Texas Instruments Incorporated, Dallas, Tex.

[21] Appl. No.: 713,039

[22] Filed: Jun. 7, 1991

Related U.S. Application Data

[63] Continuation of Ser. No. 505,743, Apr. 6, 1990, abandoned.

[51] Int. Cl.⁵ .............................................. H05K 1/00
[52] U.S. Cl. ..................................... 439/67; 439/487; 439/68; 324/158 F
[58] Field of Search ............... 439/67, 77, 68-73, 439/330, 331, 525, 487; 361/386, 387, 388, 389, 398-400, 412-415; 324/158 F

[56] References Cited

U.S. PATENT DOCUMENTS

| | | | |
|---|---|---|---|
| 3,766,439 | 10/1973 | Isaacson | 439/77 |
| 4,169,642 | 10/1979 | Mouissie | 439/67 |
| 4,341,842 | 7/1980 | Cutchaw | 439/485 |
| 4,597,617 | 7/1986 | Enochs | 361/398 |
| 4,679,118 | 7/1987 | Johnson et al. | 361/386 |
| 4,859,189 | 8/1989 | Peterson et al. | 439/67 |
| 4,922,376 | 5/1990 | Pommer et al. | 361/413 |

*Primary Examiner*—David L. Pirlot
*Attorney, Agent, or Firm*—B. Peter Barndt; Richard L. Donaldson

[57] ABSTRACT

Disclosed is a burn-in test socket which serves as a temporary package for integrated circuit die, multichip hybrid or a complete wafer without damaging the bonding pads or insulating passivation on the die during test and burn-in.

25 Claims, 5 Drawing Sheets

NON-DESTRUCTIVE BURN-IN TEST SOCKET FOR INTEGRATED CIRCUIT DIE

This application is a continuation of application Ser. No. 505,743, filed Apr. 6, 1990, now abandoned.

FIELD OF THE INVENTION

This invention relates to testing of semiconductor devices and multichip hybrids, and more particularly to a test socket which serves as a temporary package for integrated circuit devices during testing and burn-in.

CROSS REFERENCED INVENTION

This invention uses technology similar, in part, to copending patent application Ser. No. 505,810, filed Apr. 6, 1990, entitled PROBE CARD FOR TESTING OF SEMICONDUCTOR DEVICES.

BACKGROUND OF THE INVENTION

In the manufacture of semiconductor multi-chip hybrids and systems, the yield of the hybrid is a function of the yield of the interconnecting substrate, and the passive and active circuit components. The interconnect and passive components in the hybrid can be visually and electrically inspected prior to assembly, and their properties remain fairly constant over the expected lifetime of the hybrid. However, the failure rate of an integrated circuit has been shown to vary with time. Early in the life of an integrated circuit, a relatively large number of devices will fail, due to defects introduced in the manufacturing process. Only by exercising the die during a "burn-in" test, will the initial failure rate drop to an acceptable level.

There are no techniques currently available which allow burn-in testing of integrated circuits without damaging the die. If the die are not burned-in, then the yield loss for each device can drastically reduce the yield of the hybrid. Re-work of Tape Automated Bonding (TAB) and flip-chip mounted devices, which are used in hybrid circuits, is very labor intensive and time consuming. The re-work process is difficult to automate in a production environment, and re-worked hybrids often exhibit lower reliability than parts which do not require repair. The high costs associated with re-work indicates the importance of incorporating devices which exhibit low failure rate in the hybrid. If potentially defective die can be detected before they are committed to a package, then the subsequent yield for the completed hybrid will improve.

There are currently two techniques for the burn-in testing of integrated circuits. The most widely used method involves placing the device in a package and wire-bonding the extra or enlarged test pads to signal leads in the package. The packaged device is then plugged into the burn-in test system for testing. After testing, the wire bonds are broken off before the die is inserted on the hybrid. The other test method is to use a conventional probe card for burn-in testing. This probe card is similar to the card which is used for functional testing of the device. The problem with these test methods is that they tend to damage the integrated circuit die.

Removal of the bond wires tends to damage the bond pads on the device, resulting in lower yielding bonds. Burn-in testing using a probe card also damages the test pads on the device. The thermal expansion of the probe needles and the scrub-in of the probe tips may tear the test pads and crack the protective oxide on the device. Hybrid manufacturers must currently decide between assembling hybrids with pre-tested, but damaged devices, or chips which have not been tested.

BRIEF SUMMARY OF THE INVENTION

The invention is a burn-in test socket which serves as a temporary package for integrated circuit die during testing. The temporarily packaged unmounted integrated circuit die allows the semiconductor die to be thoroughly tested at burn-in without damaging the bonding pads or the protective oxide on the semiconductor die. The test socket uses a compliant probe head to probe the bond pads on the device. The probe head distributes the signals from the device under test (DUT) to the system while providing a controlled impedance signal environment. Either bare or bumped contact integrated circuit die may be tested prior to assembly into a hybrid package.

The test fixture contains three components. The first part of the fixture is , for example, a flexible film probe head which provides the electrical contact between the bond pads on the semiconductor die and the rest of the test socket. A Second part is a modified Pin Grid Array (PGA) package, to which the probe head is attached. The third part of the test fixture is a heat sink and clamp mechanism which holds the DUT in place, and cools the die while holding the test socket together.

The probe head is made from a suitable polymer dielectric, for example, polyimide, which is coated on a suitable substrate material, for example aluminum. Alternating layers of a polymer dielectric and metal signals lines are deposited on the substrate until the membrane is complete. On top of this thin film structure, probe bumps or "pillars" are plated which are used for probing the DUT test pads. A hole in the back of the substrate is etched away producing a flexible membrane in the center of the substrate where the probe bumps are located. An insert plate is used to keep the probe bumps in a common plane. An elastomer is poured into the cavity and cured, after which a backing plate is attached to the metal ring which remains connected to the membrane.

The membrane probe head is then attached to the PGA and wire bonded. The DUT is placed in a metal heat sink. The membrane/PGA assembly and the heat sink are brought together, bringing the test pads on the DUT into contact with the bumps on the membrane. Visual alignment is possible through clear elastomer and backing plate, through the hole in the PGA. Alignment may be accomplished by other optical or sensor means, for example infrared.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figures 1, 1A:
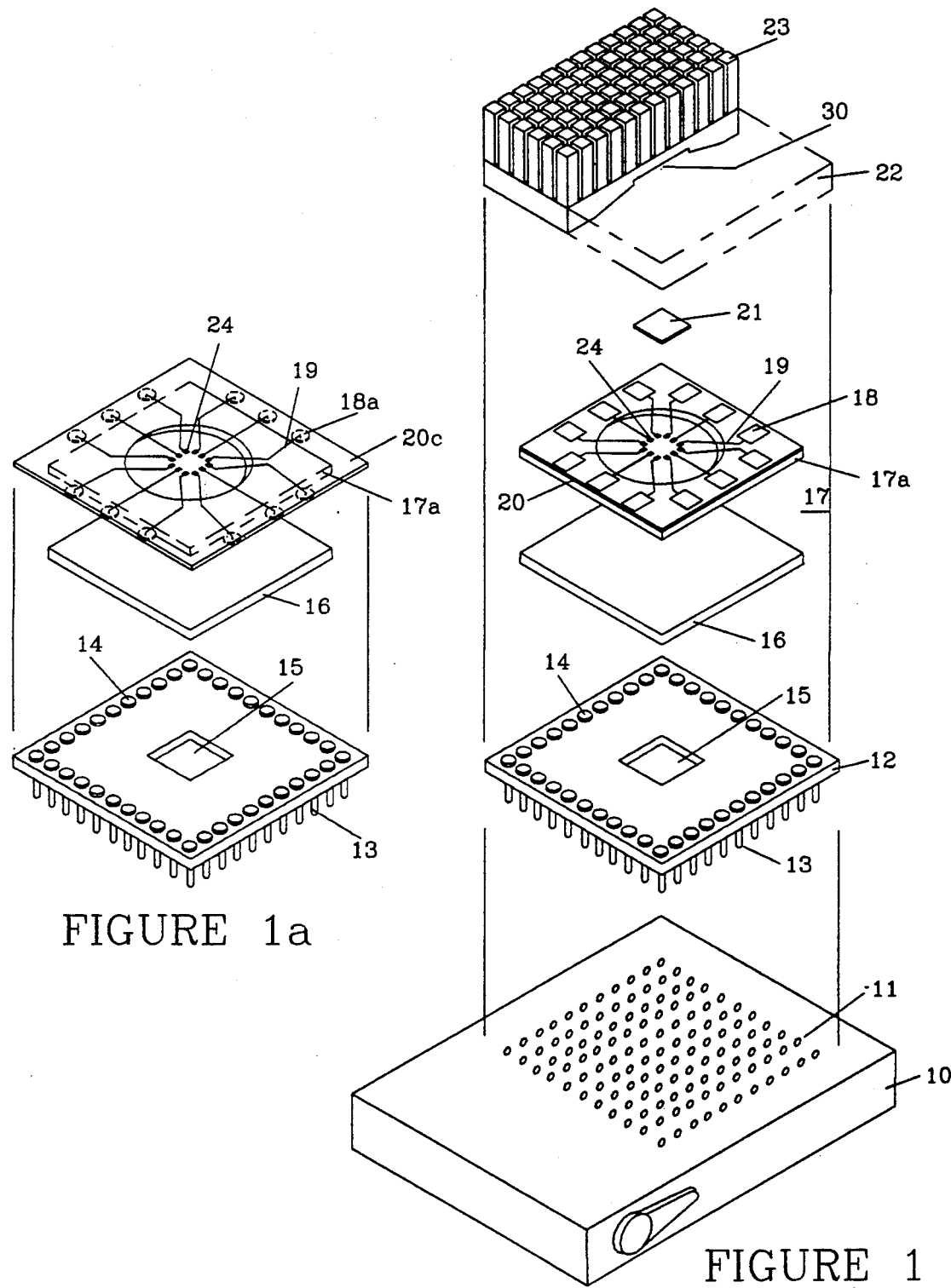
FIG. 1 is an explode view of an embodiment of the present invention.
FIG. 1a is a partial exploded view of FIG. 1 with a double-sided membrane probe head.

FIG. 1 is an exploded view of the burn-in test socket of the present invention. A test socket base 10 has a plurality of pin sockets therein. Socket base 10 is connected to a test system (not illustrated) used to test the device mounted in the test fixture.

PGA 12 has a plurality of pins 13 mounted therein which correspond to the pin sockets 11 in base 10. PGA 12 also has a plurality of bond pads 14, one for each pin 13. PGA 12 also has an opening 15 in the center thereof for use in aligning a semiconductor device in the test fixture.

Thin film probe 17 has a base 17a with a thin film 20 of, for example, polyimide thereon covering one side of the base 17a. A plurality of wire bond pads 18 are formed on the polyimide film 20 and are adjacent to the bond pads 14 on socket 12, as hereinafter described. Wire bond pads 18 are connected to contact bumps 24 (FIG. 3) through the thin film by signal lines 19. An insert 26 plate is attached directly behind the contact bumps 24. A transparent backing plate 16 is mounted behind the base 17a as hereinafter described.

Heat sink 22 has a plurality of fingers 23 on the top thereof to help dissipate heat from semiconductor die 21, which is mounted in cavity 30 in the heat sink. When heat sink 22 and probe head 17 are brought into contact with each other, the cavity 30 holds semiconductor die 21 in place, and the test pads thereon (not illustrated) contact the bumps 24 on probe head 17.

FIG. 1a is partial exploded view as in FIG. 1 except that the membrane 20c is double-sided, i.e. contacts 18a are on the bottom side of a part of membrane 20c that extends beyond the edges of base 17a. Signal lines 19, which may be on top of membrane 20c or sandwiched between multiple layers of polyimide which may make up membrane 20c, connect bumps 24 with contacts 18a. Contacts 18a make contact with respective contacts 14 on socket 12 when the assembly is brought together.

Figure 2:
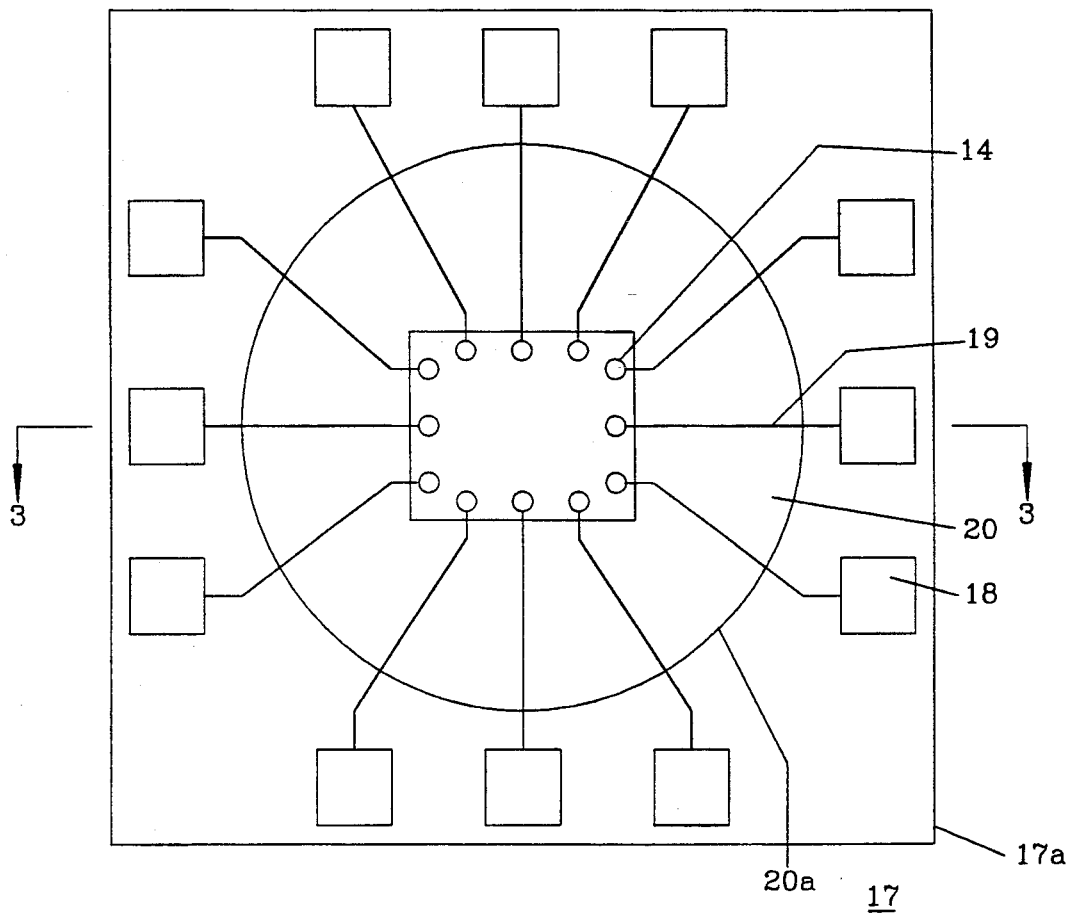
FIG. 2 is a top view of the probe head.
Figure 3:
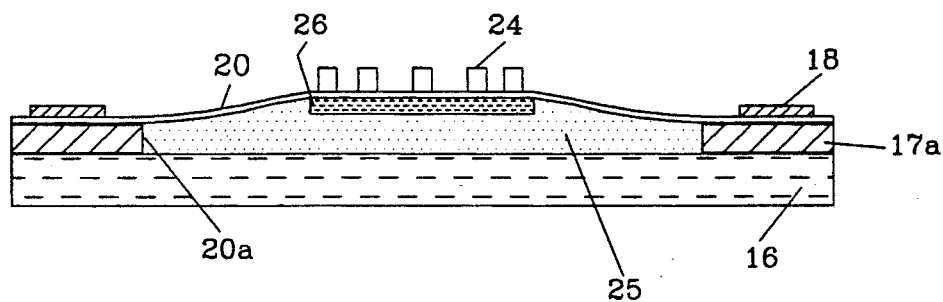
FIG. 3 is a cross-sectional view of the probe head.

FIGS. 2 and 3 illustrate thin film probe head 17. The probe head is made from, for example, polyimide coated on an aluminum base. Alternating layers of polyimide dielectric 20 and metal signal lines 19 are formed. Gold or copper bumps 24 are formed on the top layer of polyimide and are connected to the wire bond pads 18 via the signal lines 19. A hole 20a is etched in the metal base 17a producing a flexible membrane 20b in the center of the probe where bumps 24 are located. An insert plate 26 is placed under the bumps 24 to keep the bumps in a common plane. A clear elastomer 25 is poured in opening 20a and cured, after which a transparent backing plate 16 is attached to the back of the remaining ring 17a.

FIG. 3 is a cross-sectional view of the probe head taken though section 3—3 of FIG. 2. Probe head base 17a is shown with the polyimide layer 20 thereon. Layer 20 has bumps 24 mounted on one side and an insert plate 26 on the other side. Elastomer 25 fills the opening in base 17a and extends to the backing plate and thin film 20b. Backing plate 16 is mounted against the metal base 17a across the opening.

Figure 4:
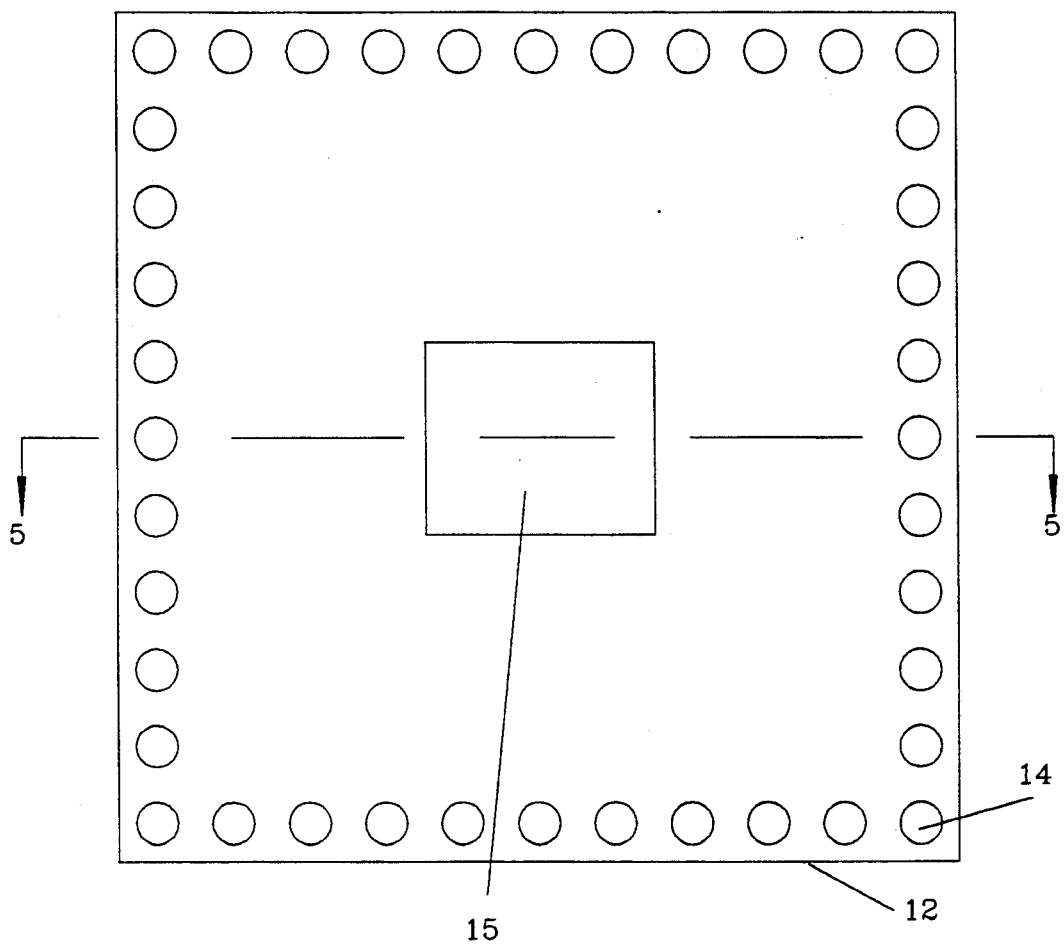
FIG. 4 is a top view of a pin grid array package socket used with the probe head.

The probe head illustrated in FIGS. 3 and 4 shows a bump pattern for a single die, but the probed head could be configured to a plurality of semiconductor die, a complete semiconductor wafer, or to the contact pads on a hybrid device.

Although not illustrated, ground planes and multiple signal layers may be included on the flexible film 20b, and placed at desired areas around and between the contact bumps 24.

Figure 5:
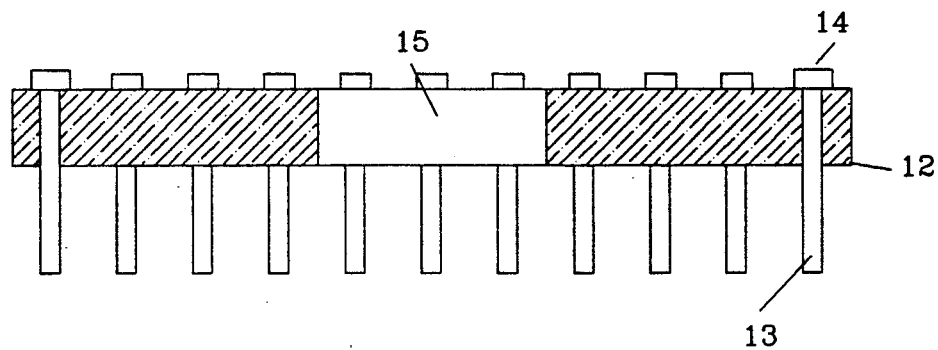
FIG. 5 is a cross-sectional view of the socket of FIG. 4.

FIGS. 4 and 5 are top view and cross-sectional view, respectively, of pin grid array package plug 12 which is used in the test fixture for testing semiconductor die. The plug is a custom variation of a standard PGA package. There is an opening 15 in plug 12 used in aligning the semiconductor die. Pins 13 extend through the body of plug 12 and have bond pads 14 on the tops of the pins. Bond pads 14 are wire bonded to wire bond pads 18 on the probe head (FIG. 6).

Figure 6:
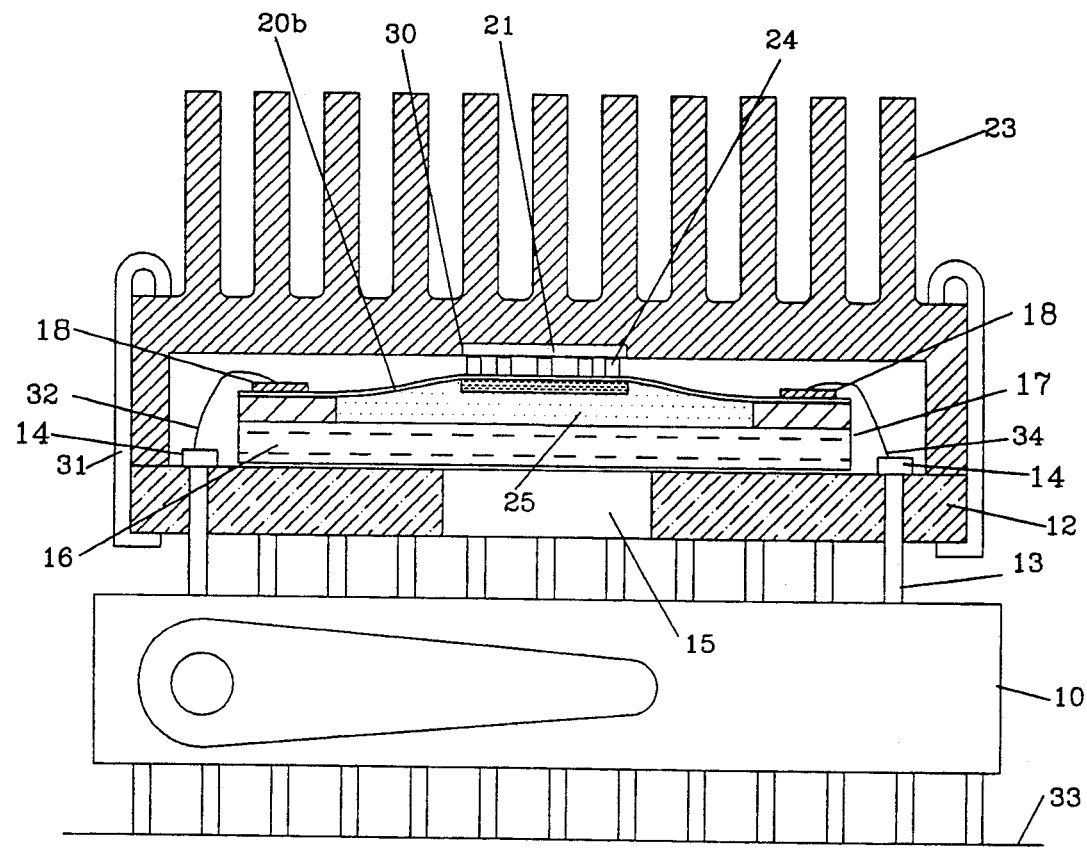
FIG. 6 is cross-section view of the assembled burn-in test socket assembly.

FIG. 6 is a cross-sectional view of the assembled burn-in test socket assembly, including the heat sink 23 with a semiconductor die 21 in place in cavity 30 of the heat sink 23. Prior to burn-in testing, a die 21 is placed in the cavity 30. Membrane probe 17 is positioned with contact bumps 24 in contact with test pads (not illustrated) on the semiconductor die. Membrane probe and die are aligned by looking through the alignment window 15. After alignment, the heat sink and membrane probe 17 are secured together by heat sink clips 31.

Probe head 17 is secured to socket 12 and wire bond pads 18 on membrane probe 17 are wire bonded, with wires 32 and 34, to bond pads 14 on socket 12.

The compression of elastomer 25 provides slight scrubbing action which is necessary for good electrical contact between the contact bumps 24 and test pads on the semiconductor die. After the test fixture is assembled, it is plugged into socket 10 which is mounted on test board 33 for burn-in testing. When testing is complete, the test socket is opened and the good die removed for assembly into a hybrid device.

The burn-in test socket permits higher yields for hybrid devices since only good die are used. During testing, the bumps on the probe head will not damage the bond pads on the die due to he contact force. The polyimide which is used for the film has a thermal coefficient of expansion which is similar to silicon, thereby eliminating thermal expansion mismatch problems. The thin film probe head is fabricated using wafer processing technology, thus allowing precise positioning of the probe bumps on the film.

Figure 7:
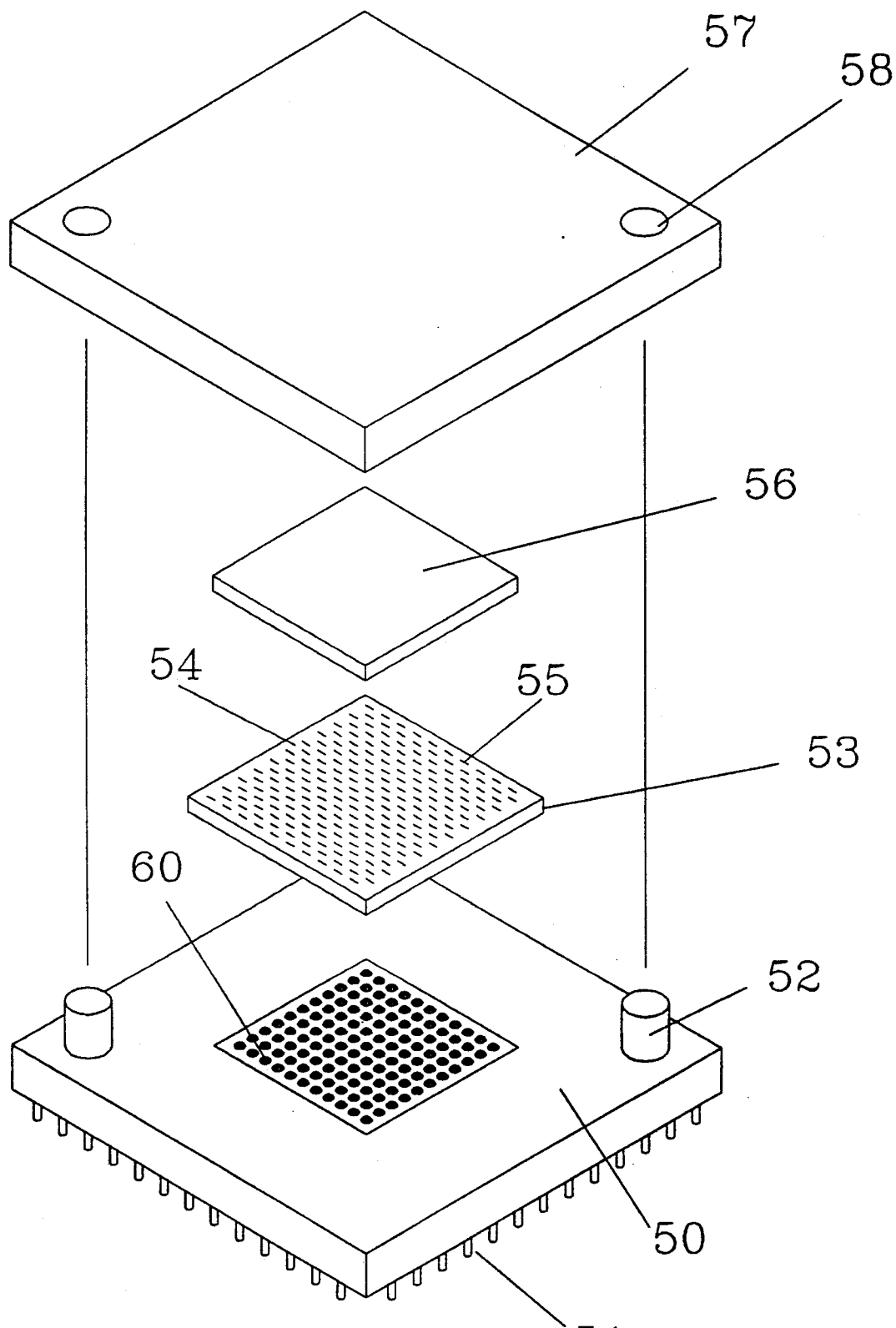
FIG. 7 is an explode view of another embodiment of socket and probe head assembly.

FIG. 7 illustrates another embodiment of a socket/probe head assembly. Socket 50 has a plurality of connection pins 51 extending out one side. These pins make connection with a test system board socket (not illustrated) to interface the socket with a test system. Socket 50 also has an array of contact bumps thereon, each bump isolated from the others and electrically connected to a respective pin 51.

Elastomer 53 has a surface 54 with an array of contacts 55 formed in a pattern which matches the contact pattern (not illustrated) on semiconductor die 56. Contacts 55 extend through elastomer 53 to contact with contact bumps 60 on socket 50. Each contact on the opposite side (bottom side as illustrated) is positioned to contact one of the contact bumps 60 on socket 50.

Elastomer 53 may be made from an array of fine rectangular wires in a silicone rubber base. The wires are rectangular in shape and extend from surface 54 of the silicone rubber base to the bottom side adjacent contact bumps 60 on socket 50. Such an array is manufactured by Elastomeric Technologies, Inc., Hatboro, Pa., and distributed under the name MATRIX MOE.

Heat sink 57 is positioned over semiconductor die 56, to remove excessive heat from the die during testing, and hold die 56 in contact with probe card 53. Heat sink 57 is positioned and aligned on socket 50 by positioning pins 52 on socket 50 in alignment holes 58 on heat sink 57. A recess (not illustrated) may be formed in the side of heat sink 57 positioned against die 56 to align die 56 and the contact pads thereon with contacts 55. Contact pattern 60 may be different from the pattern illustrated so as to accommodate differently configured semiconductor die.

What is claimed:

1. A non-destructive burn-in test socket for interconnecting with contact pads on an integrated circuit die, comprising:
   a test socket base for plugging into a test system;
   a flexible membrane assembly connected to the test socket base and having a plurality of contacts thereon for temporarily contacting the contact pads on a semiconductor die during testing;
   bond pads on said test socket base for interconnecting with the flexible membrane assembly; and
   a heat sink for holding a semiconductor die in temporary contact with the contacts on the flexible membrane assembly and transferring heat from the semiconductor die during testing;
   wherein the test socket base includes an opening to permit visual alignment of the semiconductor die with the contacts on the flexible membrane.

2. The socket according to claim 1, wherein the flexible membrane includes at least one signal layer thereon.

3. The socket according to claim 1, wherein the flexible membrane assembly is of a size and having an array of contacts thereon for contacting a plurality of semiconductor dies on a semiconductor wafer.

4. The socket according to claim 1, wherein the flexible membrane assembly is of a size and having an array of contacts thereon for testing multichip hybrids.

5. The socket according to claim 1, wherein the flexible membrane assembly includes alternating layers of dielectric and metal signal lines.

6. The socket according to claim 1, wherein the heat sink is attached to the test socket base with clips to hold the semiconductor die in contact with the contacts on the flexible membrane assembly.

7. The socket according to claim 1, wherein the flexible membrane is a silicone rubber having rectangular contacts extending through the membrane.

8. The socket according to claim 1, including clips for holding the socket base, membrane, and integrated circuit die together during testing.

9. The socket according to claim 1, wherein the flexible membrane assembly includes a flexible membrane attached to a metal frame, and includes metal leads extending from the plurality of contacts for contacting the contact pads on the semiconductor die to a plurality of wire bond pads.

10. The socket according to claim 9, wherein the flexible membrane includes at least one ground plane thereon.

11. The socket according to claim 1, wherein the flexible membrane assembly includes a backing plate to keep the contacts on the flexible membrane in a common plane.

12. The socket according to claim 11, including an elastomer polymer at least partially supporting the flexible membrane.

13. The socket according to claim 12, wherein the elastomer polymer is transparent.

14. A non-destructive burn-in test socket for connecting to contact pads on an integrated circuit die, comprising:
   a test socket base for plugging into a test system;
   a flexible membrane assembly connected to the test socket base and having a plurality of contacts extending through the membrane for interconnecting the semiconductor die to the test socket base;
   wherein the flexible membrane assembly includes a flexible membrane attached to a metal frame, and includes metal leads extending from the plurality of contacts for temporarily contacting the contact pads on the semiconductor die to a plurality of wire bond pads;
   bond pads on said test socket base for interconnecting with the flexible membrane assembly; and
   a heat sink for holding a semiconductor die in temporary contact with the contacts on the flexible membrane assembly and transferring heat from the semiconductor die during testing;
   wherein the test socket base includes an opening to permit visual alignment of the semiconductor die with the contacts on the flexible membrane.

15. The socket according to claim 14, wherein the flexible membrane includes at least one ground plane thereon.

16. The socket according to claim 14, wherein the flexible membrane includes at least one signal layer thereon.

17. The socket according to claim 14, wherein the flexible membrane assembly is of a size and having an array of contacts thereon for contacting a plurality of semiconductor dies on a semiconductor wafer.

18. The socket according to claim 14, wherein the flexible membrane assembly is of a size and having an array of contacts thereon for testing multichip hybrids.

19. The socket according to claim 14, wherein the flexible membrane assembly includes alternating layers of dielectric and metal signal lines.

20. The socket according to claim 14, wherein the heat sink is attached to the test socket base with clips to hold the semiconductor die in contact with the contacts on the flexible membrane assembly.

21. The socket according to claim 14, including clips for holding the socket base, membrane, and integrated circuit die together during testing.

22. The socket according to claim 14, wherein the flexible membrane assembly includes a backing plate to keep the contacts on the flexible membrane in a common plane.

23. The socket according to claim 22, including an elastomer polymer at least partially supporting the flexible membrane.

24. The socket according to claim 23, wherein the elastomer polymer is transparent.

25. A non-destructive burn-in test socket for temporarily connecting to contact pads on an integrated circuit die, comprising:
   a test socket base for plugging into a test system;
   a flexible membrane assembly for interfacing with the test socket base, and having a plurality of contacts extending through the membrane for temporarily interconnecting the semiconductor die to the test socket base;
bond pads on said test socket base for interconnecting with the flexible membrane assembly; and
a heat sink for holding the semiconductor die in temporary contact with the contacts on the flexible membrane assembly and transferring heat from the semiconductor die during testing.

* * * * *